United States Patent [19]
Choi

[11] Patent Number: 6,157,575
[45] Date of Patent: Dec. 5, 2000

[54] NONVOLATILE MEMORY DEVICE AND OPERATING METHOD THEREOF

[75] Inventor: Jeong-Hyuk Choi, Suwon, Rep. of Korea

[73] Assignee: Samsung Electronics Co., LTD, Rep. of Korea

[21] Appl. No.: 09/274,668

[22] Filed: Mar. 23, 1999

[30] Foreign Application Priority Data

Mar. 26, 1998 [KR] Rep. of Korea ............... 98-10516

[51] Int. Cl.[7] ........................................ G11C 11/34
[52] U.S. Cl. ............................ 365/185.29; 365/185.17
[58] Field of Search .................. 365/185.17, 185.29, 365/185.33

[56] References Cited

U.S. PATENT DOCUMENTS 5,638,327   6/1997   Dallabora et al. .............. 365/185.33

OTHER PUBLICATIONS

Mukherjee, Satyen, et al., A Single Transistor EEPROM Cell and its Implementation in a 512K CMOS EEPROM, IEDM Technical Digest, Dec. 1985, pp. 616–619.

*Primary Examiner*—David Nelms
*Assistant Examiner*—M. Tran
*Attorney, Agent, or Firm*—Samuels, Gauthier & Stevens LLP

[57] ABSTRACT

There is provided a nonvolatile memory device and an operating method therof which can perform byte erasing and can be implemented high integration. The nonvolatile memory device has a plurality of cells, each including a stacked gate structure of a floating gate and a control gate. The cells are formed in an area where a plurality of bit lines arranged in parallel at specific intervals perpendicularly intersect a plurality of word lines arranged at specific intervals. The cells also include a plurality of source lines, each being arranged in parallel with the bit lines every byte, and a plurality of source select transistors formed in an area where the source lines intersect the word lines. Two cells are connected to a bit line via one bit line contact. Two cells symmetrically arranged with respect to each other and connected to the same bit line via respective bit line contacts share one active source region. The active source region is in parallel with the word line and is connected to the source line via the source select transistor and a source line contact, and the source line is electrically isolated from another source line.

10 Claims, 15 Drawing Sheets

NONVOLATILE MEMORY DEVICE AND OPERATING METHOD THEREOF

BACKGROUND OF THE INVENTION

1. Field of the Invention

The present invention relates to a nonvolatile memory device and an operating method thereof, and more particularly, to a high density nonvolatile memory device which can perform byte erasing and an operating method thereof.

2. Description of the Related Art

Semiconductor memory devices are largely divided into RAMs (Random Access Memories) such as DRAMs (Dynamic RAMs) and SRAMs (Static RAMs), and ROMs (Read Only Memories) including PROMs (Programmable ROMs), EPROMs (Erasable PROMs), and EEPROMs (Electrically Eraseable PROMs). RAMs are referred to as volatile memories in that data is destroyed with passage of time. ROMs retain data once it is entered. Among such ROMs, demand for EEPROMs and flash memory cells is increasing.

Flash memory cells can be of a NOR type or a NAND type. The NAND type flash memory cell, useful for realizing high integration, includes a unit string composed of n cells connected in series. Unit strings are connected in parallel between bit lines and ground lines. The NOR type flash memory cell, providing high-speed operation, has cells connected in parallel between bit lines and ground lines.

A description of the structure and operation of a basic NOR flash memory cell, proposed by Excel Co., in 1985, disclosed in IEDM'85, pp. 6I6~619, "A Single Transistor EPROM Cell And Its Implementation In A 512K CMOS EEPROM," will hereinbelow be given in conjunction with FIGS. 1 to 3. FIG. 1 is a partial schematic layout diagram of a memory cell array in a known NOR flash memory device, FIG. 2 is an equivalent circuit diagram of the memory cell array of FIG. 1, and FIG. 3 is a schematic cross-sectional view of a unit cell. Here, reference numeral 10 denotes a semiconductor substrate, reference numeral 11 denotes an active source region, reference numeral 14 denotes a tunnel oxide film, reference numeral 16 denotes a floating gate, reference numeral 18 denotes an interpoly dielectric layer, reference numeral 20 denotes a control gate, reference numerals 24a and 24b denote source and drain regions, respectively, and reference numeral 28 denotes a bit line contact.

Referring to FIGS. 1 to 3, a unit cell having a stacked gate structure of the floating gate 16 and the control gate 20 is formed in an area where the word line W/L perpendicularly intersects the bit line B/L formed of a metal in memory cell arrays, each memory cell array having word lines W/L, source lines CSL, and a plurality of bit lines B/L arranged at specified intervals. Two cells are connected to the bit line B/L by the single bit line contact 28, and the active source region 11 formed of an impurity layer and disposed in parallel with the word line W/L, is connected by the source line CSL arranged in every tens of bits and in parallel with the bit line B/L.

In a unit cell, the tunnel oxide film 14 is interposed between the floating gate 16 and the substrate 10, and the interpoly dielectric layer 18 is interposed between the floating gate 16 and the control gate 20 acting as a word line W/L. The source and drain regions 24a and 24b are formed in self-alignment with the stacked gate. The floating gate 16 extends across an active region and portions of the edges of field regions at both sides of the active region, thus being isolated from that of an adjacent cell. The control gate 20 i, connected to that of an adjacent cell, thus forming a word line W/L.

Adjacent cells are formed in opposite directions, sharing the source/drain regions 24a and 24b. The drain region 24b of a unit cell is connected to that of an adjacent cell in the same row, and has the bit line contact 28 formed therein. Bit line contacts 28 in the same row are electrically connected by the bit line B/L perpendicular to the word line W/L. That is, two cells are connected to the bit line B/L by a single bit line contact 28.

The source region 24a of the unit cell is connected to that of an adjacent cell in the same column through the active source region 11 formed of an impurity diffusion layer parallel to the word line W/L. In addition, to reduce the resistance of the source line, a single source line contact 29 is formed in the active source region 11 parallel to the word line W/L, for a plurality of bit lines B/L. The source line CSL parallel to the bit line B/L is electrically connected to the active source region 11 through the source line contact 29.

Such a general NOR flash memory cell is programmed by CHE (channel hot electron) injection and erased through a source or a bulk substrate by Fowler-Nordheim tunnelling. For a programming operation, the threshold voltage Vth of a cell is increased from an initial level, about 2V, to about 7V by storing electrons on the floating gate 16. That is, by applying 6~7V to the selected bit line B/L and 10~12V to the selected word line W/L, and 0V to the source and the bulk substrate, parts of the CHEs are introduced into to the floating gate 16 via the tunnel oxide film 18. Thus, the cell is programmed.

For an erasing operation, the threshold voltage Vth of the cell is dropped to the initial level, about 2V, by removing electrons from the floating gate 16. That is, by floating the selected bit line B/L and applying 12~15V to the source and 0V to the selected word line W/L, the electrons are removed, by Fowler-Nordheim tunnelling, from the floating gate 16 to the source junction via the tunnel oxide film 18 of about 100 Å, due to a potential difference between the floating gate 16 and the source junction. Typically, the source junctions of all cells are electrically connected to one another by the active source region 11, such that all cells of a chip are collectively erased, or the chip is divided into a plurality of blocks in the direction of word line or bit line, to collectively erase the cells in the unit of block.

A reading operation refers to determining the presence or absence of a current path through erased and programmed cells by applying about 1V to the selected bit line B/L and 4~5V to the word line W/L.

Here, the common source line CSL serves to discharge a large amount of current generated via the cells during a programming operation, to a ground rode. To discharge a large amount of current in a short time in the flash memory cell using CHE injection, one common source line CSL is formed every tens of bits, e.g., every 16~32 bits.

Hereinbelow, a description will be given to a cell structure in a conventional EEPROM device. FIG. 4 is an equivalent circuit diagram of a part of a memory cell array in a conventional EEPROM device, and FIG. 5 is a schematic cross sectional view of a unit cell. Here, reference numeral 50 denotes a semiconductor substrate, reference numeral 52 denotes a tunnel oxide film, reference numeral 53 denotes a gate oxide film, reference numeral 54 denotes a floating gate, reference numeral 56 denotes an interpoly dielectric layer, reference numeral 58 denotes a control gate and reference numerals 62a and 62b denote source/drain regions.

Referring to FIGS. 4 and 5, a unit cell composed of two transistors is formed in an area where word lines W/L perpendicularly intersect bit lines B/L. That is, the unit cell is composed of a select transistor connected to a bit line contact and a memory cell transistor connected to the active source region.

The memory cell transistor is a stacked gate structure where the floating gate 54 is formed on the semiconductor substrate 50 with interposition of the tunnel oxide film 52. The control gate 58 is stacked over the floating gate 54 with interposition of the interpoly dielectric layer 56. The source region 62a of the memory cell transistor is connected to the common source line CSL via the active source region.

The floating gate 54 and the control gate 58 are coupled by a metal line through a butting contact on a field region of the cell array, because the select transistor requires no floating gate for storing data. Hence, the select transistor operates as a MOS transistor having a single-layer gate 60 in electrical terms. In addition, to prevent the tunnelling to the gate 60 of the select transistor, the gate oxide film 53 of the select transistor is formed to be thicker than the tunnel oxide film 52 of the memory cell transistor. The drain region 62b of the select transistor is coupled to the bit line B/L via the bit line contact.

Further, in such an EEPROM cell array, each of byte select lines (S/L1, S/L2, . . . ), which are in parallel with the bit line B/L and are of an identical conductivity type to the bit line B/L, is arranged every byte, and the common source line CSL is arranged every tens of bits and connected to the active source region like the flash memory cell array.

The EEPROM cell has a complicated structure as shown in FIGS. 4 and 5 to execute the erasing operation in the unit of byte, i.e., in the unit of 8 bits. The programming, erasing and reading operations of the EEPROM cell will be discussed in detail hereinbelow.

First, an erasing operation of the EEPROM cell refers to increasing the threshold voltage Vth of the cell from the initial level, about 0V, to about +5V by storing electrons into the floating gate. That is, by applying 20V to the selected word line and the byte select line and 0V to the bit line, electrons are introduced into the floating gate by the F-N tunneling via the tunnel oxide film.

A programming operation refers to dropping the threshold voltage Vth of the cell to less than −5V by removing electrons from the floating gate. That is, by applying a program voltage of about 13V to the selected bit line, 20V to the selected word line and 0V to the byte select line, the source and the bulk substrate, the electrons in the floating gate are removed to the bit line due to the potential difference between the selected bit line and the control gate.

For a reading operation, by applying a reading voltage to the selected bit line and the word line W/L and applying 0V to the byte select line, the source and the bulk substrate, a current path is formed by the bit line voltage in the case that the cell is programmed, while the current path is not formed in the case that the cell is erased and thus the threshold voltage is over 0V. Hence, the data is determined by using the presence or absence of the current path.

Comparing the flash memory device with the EEPROM device as described above, the flash memory device is useful for high integration due to small cell size but disadvantageous in that, since the minimum unit for erasing is a block, all cell data in a block should be reprogrammed even when rewriting fewer data bits. On the contrary, the EEPROM device has a disadvantage of lower integration due to a larger cell size, because an additional byte select line is needed and a unit cell is composed of two transistors. However, it also has an advantage that it takes short time to rewrite fewer bits of data because the erasing is performed in bytes.

To make use of the advantage of each device, a combined memory device has been recently proposed which uses flash memory cells of high integration and EEPROM cells of fewer bits (e.g., a few Kbits to hundreds of Kbits). In this device, the EEPROM cells are used when rewriting fewer data bits, while the flash memory cells are used when rewriting greater amounts of data. However, since the size of the EEPROM cell is greater compared to the flash memory cell and the structure of the EEPROM cell is different from that of the flash memory cell, when cells over tens of Kbits are used, the chip size is increased and the manufacturing process or the cell operation becomes complicated.

SUMMARY OF THE INVENTION

Accordingly, an object of the present invention is to provide a high-density nonvolatile memory device which can perform byte erasing.

Another object of the present invention is to provide an operating method of a high-density nonvolatile memory device which can perform byte erasing.

To achieve the above object of the present invention, there is provided in accordance with the invention a nonvolatile memory device. The nonvolatile memory device has a plurality of cells, each having a stacked gate structure including a floating gate and a control gate. Each cell is formed in an area where a plurality of bit lines arranged in parallel at specific intervals perpendicularly intersect a plurality of word lines arranged at specific intervals. The memory device further includes a plurality of source lines, each being arranged in parallel with the bit lines at an interval of one source line for every byte of bit lines. A plurality of source select transistors are formed in an area where the source lines intersect the word lines. Two cells are connected to the bit line via one bit line contact. Two cells symmetrically arranged with respect to each other and connected to the same bit line via respective bit line contacts share one active source region. The active source region is in parallel with the word line and connected to the source line via the source select transistor and a source line contact, and the source line is electrically isolated from another source line.

In one embodiment, the active source regions are connected in the units of bytes and are thus separated from the active source region of adjacent bytes. In one embodiment, two cells sharing one bit line contact are connected to the same source line via respective active source regions, respective source select transistors and the same source line contact. In one embodiment, the source select transistor is a MOS transistor of a single-layer gate, the gate insulating layer of which is formed to be thicker than that of the cell.

In accordance with another aspect of the invention, there is provided a nonvolatile memory device having a plurality of cells, each having a stacked gate structure including a floating gate and a control gate. Each cell is formed in an area where a plurality of bit lines arranged in parallel at specific intervals perpendicularly intersect a plurality of word lines arranged at specific intervals. The memory device further includes a plurality of source lines arranged in parallel with the bit lines at an interval of one source line for every byte of bit lines. Two cells are connected to the bit line via one bit line contact. Two cells symmetrically arranged with respect to each other and connected to the same bit line via respective bit line contacts share one active source region. The active source region is in parallel with the word line and connected to the source line via a source line contact, and the source line is electrically isolated from another source line.

In one embodiment, the active source regions are connected in units of bytes and are thus separated from the active source region of adjacent bytes. In one embodiment, two cells sharing one bit line contact are connected to the same source line via respective active source regions and respective source line contacts.

In accordance with another aspect of the present invention, there is provided a method of operating a nonvolatile memory device. The nonvolatile memory device has a plurality of cells, each cell having a stacked gate structure including a floating gate and a control gate and being formed in an area where a plurality of bit lines arranged in parallel at specific intervals perpendicularly intersect a plurality of word lines arranged at specific intervals. The memory device further includes a plurality of source lines arranged in parallel with the bit lines at an interval of one source line for every byte of bit lines. A plurality of source select transistors is formed in an area where the source lines intersect the word lines. Two cells are connected to the bit line via one bit line contact. Two cells symmetrically arranged with respect to each other and connected to the same bit line via respective bit line contacts share one active source region. The active source region is in parallel with the word line and connected to the source line via the source select transistor and a source line contact, and the source line is electrically isolated from another source line. The method includes, during an erasing operation of the cell, (i) applying a negative voltage to the word line of a selected cell, (ii) applying a second voltage to adjacent word lines sharing the active source region with the selected cell, and (iii) applying a third voltage to the selected source line and floating the selected bit line, such that electrons in a floating gate of the selected cell are erased.

In one embodiment, the first voltage is equal to or greater than the second voltage.

In accordance with another aspect of the present invention, there is provided a method of operating a nonvolatile memory device. The nonvolatile memory device has a plurality of cells, each cell having a stacked gate structure including a floating gate and a control gate and being formed in an area where a plurality of bit lines arranged in parallel at specific intervals perpendicularly intersect a plurality of word lines arranged at specific intervals. The memory device further includes a plurality of source lines arranged in parallel with the bit lines at an interval of one source line for every byte of bit lines. Two cells are connected to the bit line via one bit line contact. Two cells symmetrically arranged with respect to each other and connected to the same bit line via respective bit line contacts share one active source region. The active source region is in parallel with the word line and connected to the source line via a source line contact, and the source line is electrically isolated from another source line. The method includes, during an erasing operation of the cell, (i) applying a first voltage to the word line of the selected cell, (ii) applying a second voltage to the selected source line, and (iii) floating the selected bit line, such that electrons in a floating gate of the select cell are erased.

In one embodiment, the first voltage is 0V or a negative voltage. In one embodiment, during the erasing operation of the cell, the word lines of unselected cells are floated. Also, a third voltage which is positive but lower than the second voltage can be applied to word lines of unselected cells.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Reference will now be made in detail to the preferred embodiments of the present invention.

Figure 6:
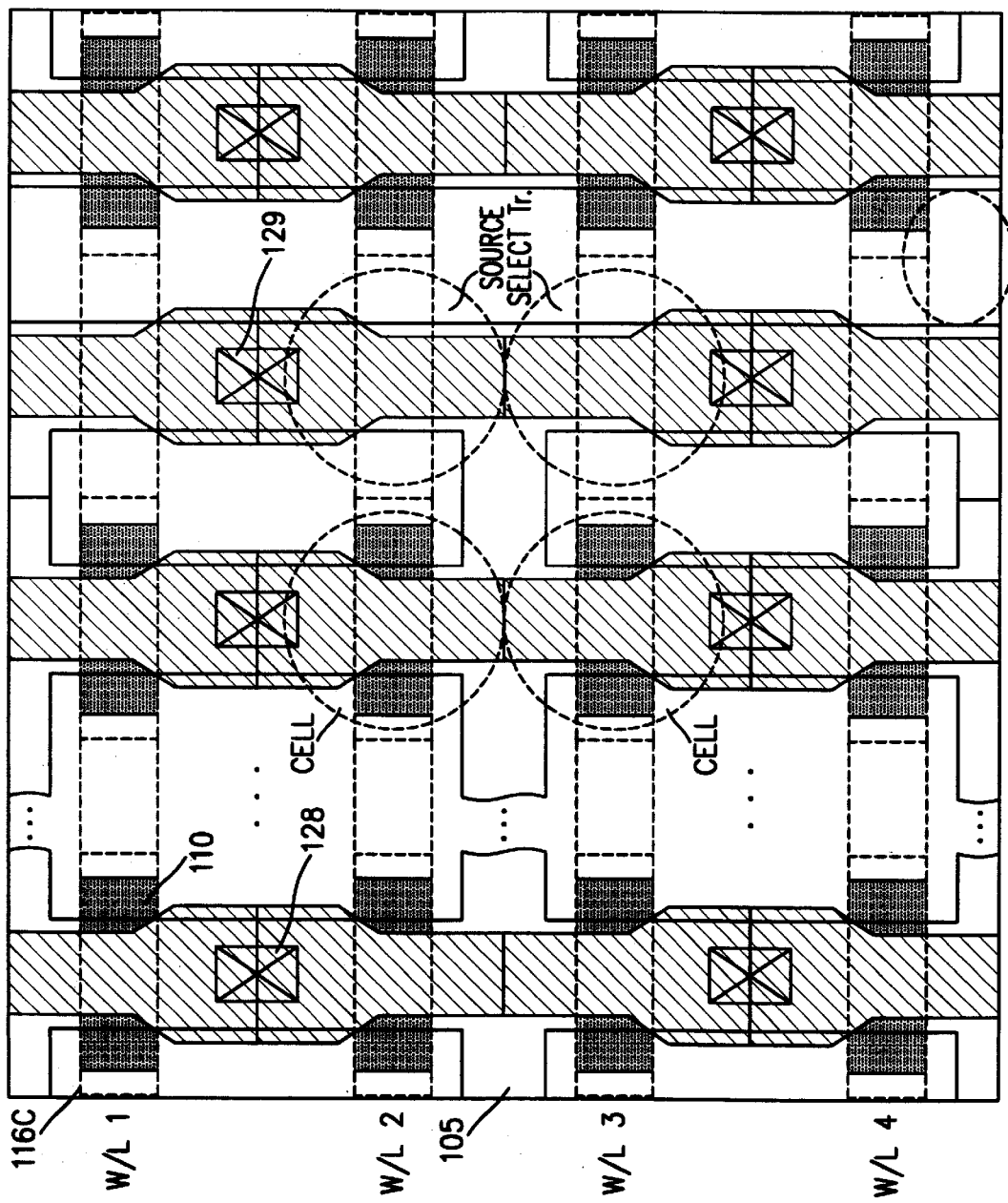
FIG. 6 is a partial schematic layout diagram of a memory cell array in a nonvolatile memory device according to one embodiment of the present invention.
Figure 7:
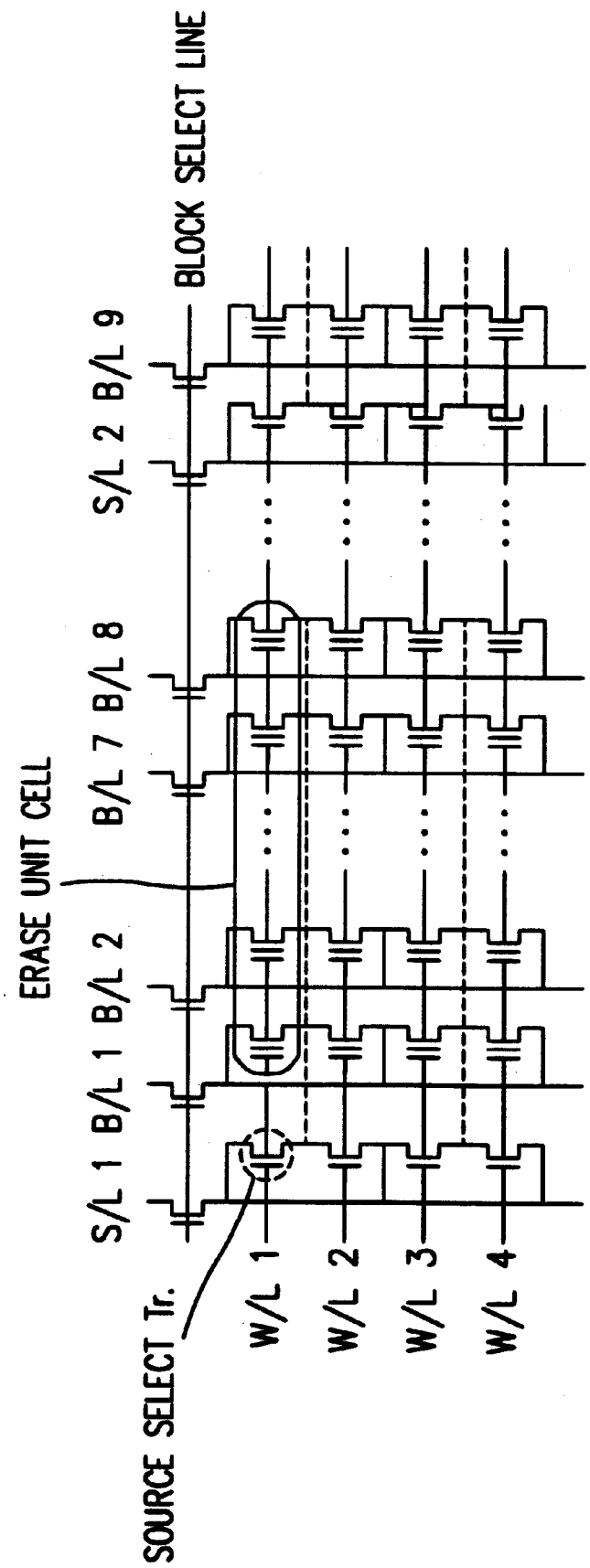
FIG. 7 is an equivalent circuit diagram of the cell array of FIG. 6.

FIG. 6 is a partial schematic layout diagram of a memory cell array in a nonvolatile memory device according to an embodiment of the present invention, and FIG. 7 is an equivalent circuit diagram of the cell array of FIG. 6. Referring to FIGS. 6 and 7, a plurality of cells having a stacked gate structure including a floating gate 110 and a control gate 116C are formed in an area where a plurality of word lines W/L arranged at specific intervals perpendicularly intersect a plurality of bit lines B/L which can be formed of a metal. Two cells are connected to a bit line B/L via a bit line contact 128.

Two cells symmetrically arranged with each other and connected to the same bit line B/L via different bit line contacts 128 share one active source region 105, and the active source regions 105 of respective cells, formed of an impurity layer and disposed in parallel with the word line W/L, are connected to source lines S/L arranged in every byte, i.e., 8 bits, and in parallel with the bit line B/L. That is, the active source regions 105 are coupled in the unit of bytes, thus being separated from that of an adjacent byte. A source line S/L is formed every byte so that it can serve to discharge a large amount of current generated while programming to a ground node and at the same time serve as a byte select line for byte erasing. The source line S/L of one byte is electrically isolated from that of an adjacent byte.

Figure 1:
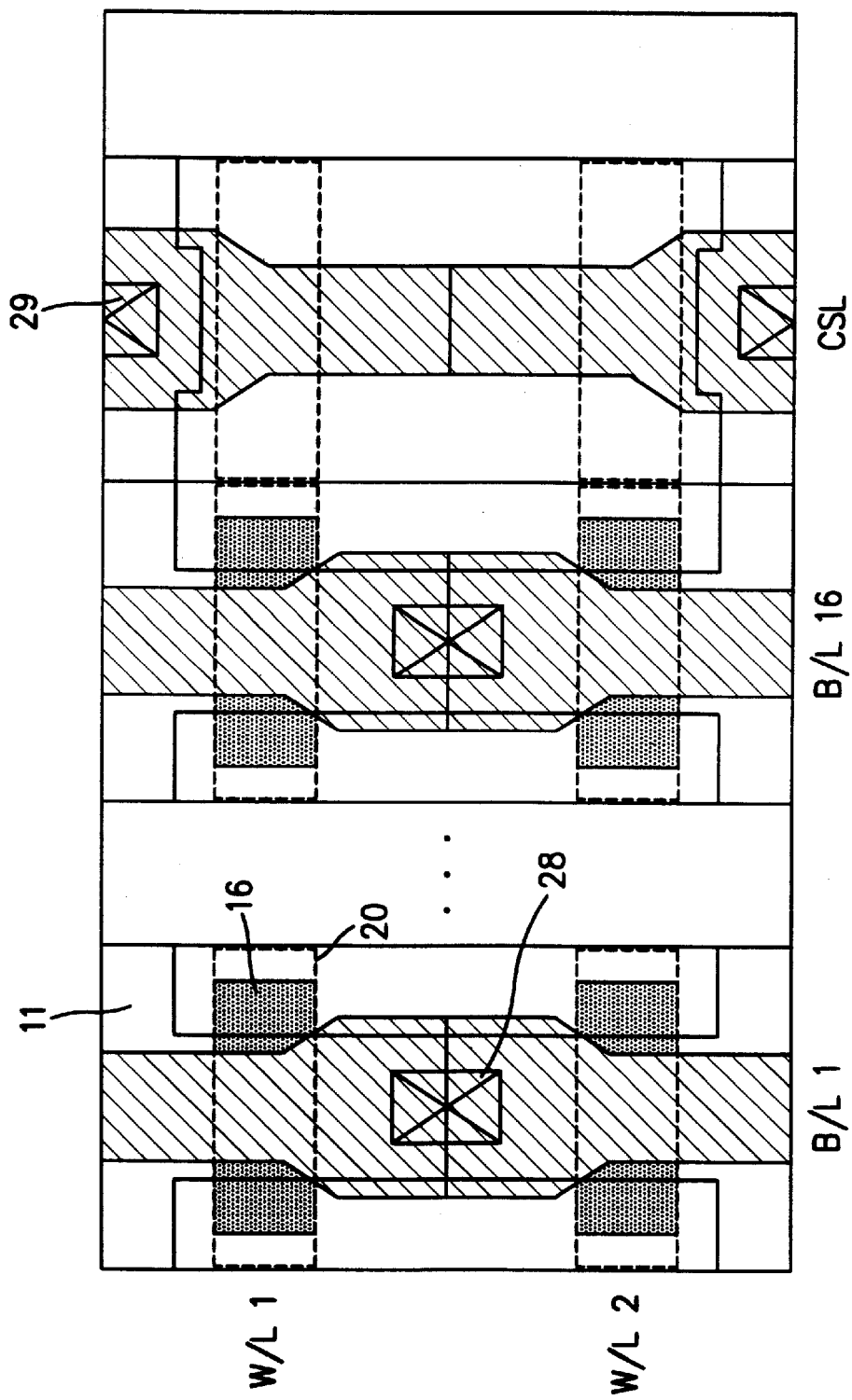
FIG. 1 is a partial schematic layout diagram of a memory cell array in a conventional NOR flash memory device.
Figure 2:
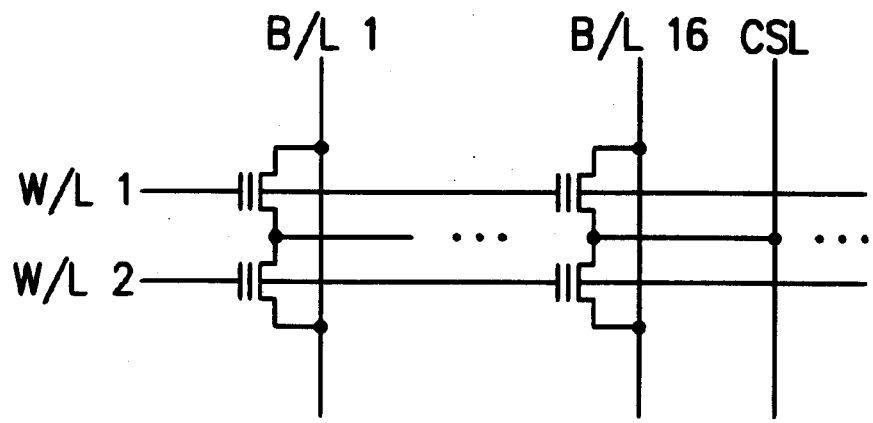
FIG. 2 is an equivalent circuit diagram of the cell array of FIG. 1.
Figure 3:
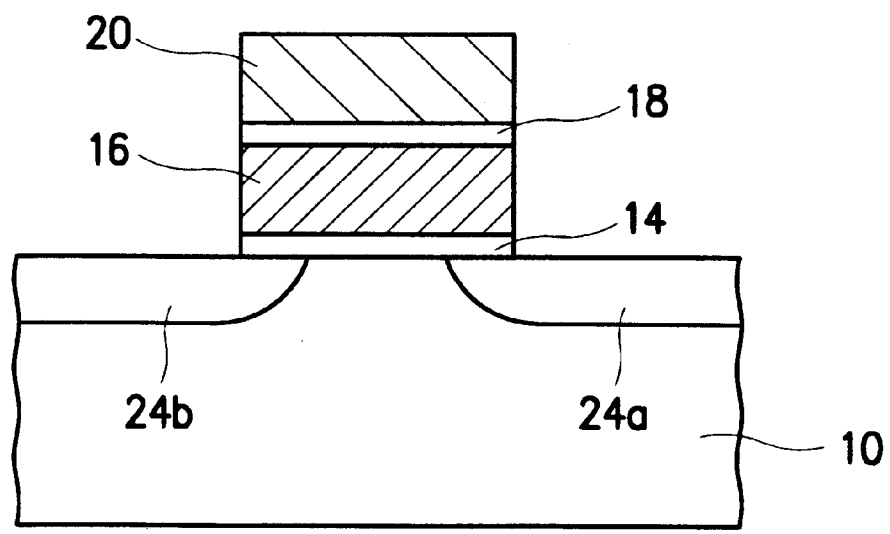
FIG. 3 is a schematic cross sectional view of a unit cell in the cell array of FIG. 1.
Figure 4:
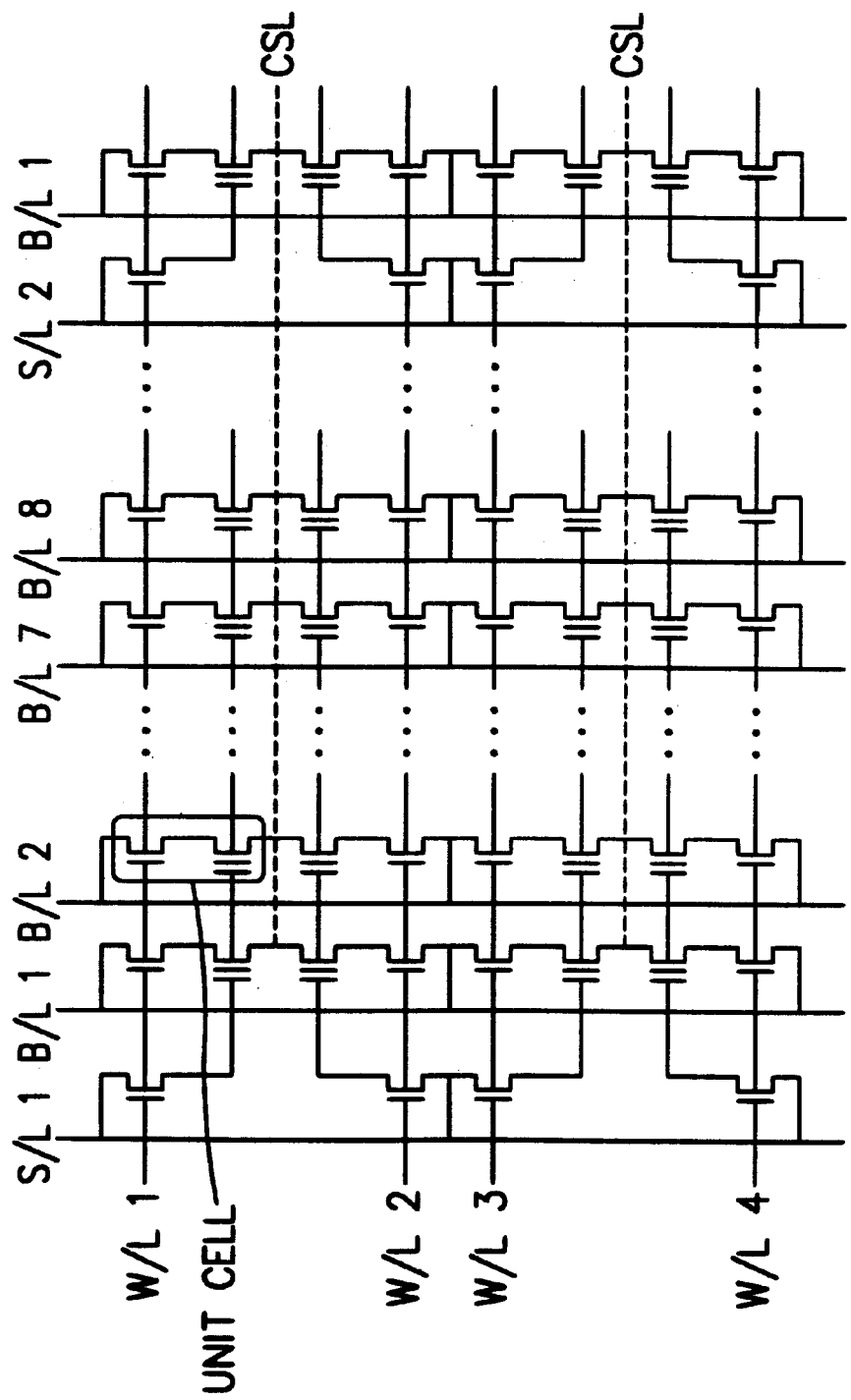
FIG. 4 is an equivalent circuit diagram of a part of a memory cell array in a conventional EEPROM device.
Figure 5:
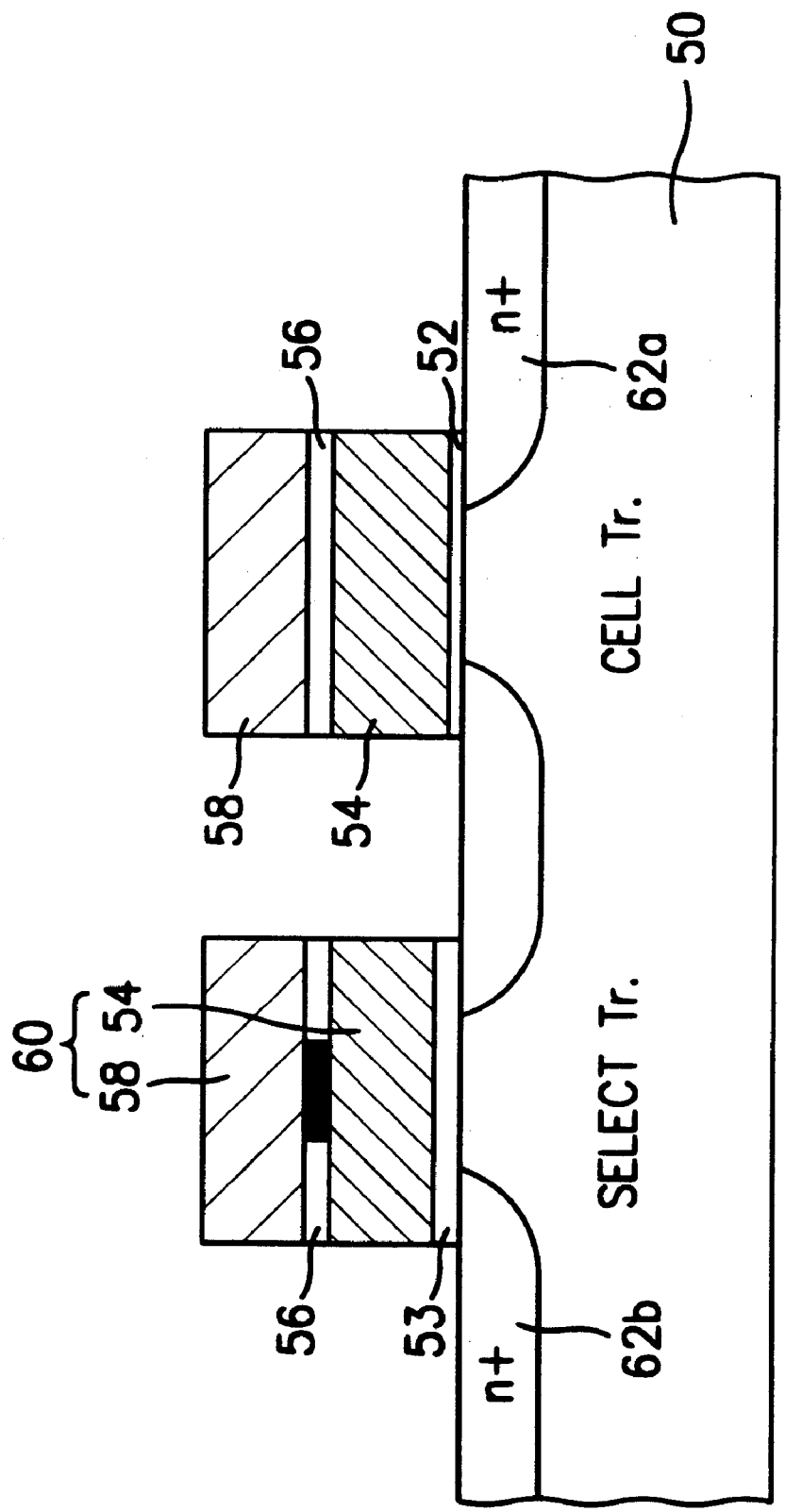
FIG. 5 is a schematic cross-sectional view of a unit cell in the cell array of FIG. 4.

A plurality of source select transistors is arranged in series in the source line S/L direction. A source select transistor having a gate is formed in an area where the source line S/L intersects the word line W/L. The active source region 105 is coupled to a source line contact 129 via the source select transistor and consequently, to the source line S/L. The source select transistor operates as a MOS transistor having a single-layer gate, and the source line contacts 129 are formed in opposite directions on the basis of the word line W/L unlike the conventional flash memory cell of FIG. 1. Hence, two cells sharing one bit line contact 128 are connected to the same source line S/L via their respective active source regions 105, respective source select transistors and their common source line contact 129.

The memory cell array of the above structure can perform byte erasing like a conventional EEPROM cell array, while having a small cell size like a conventional flash memory cell. The cell operations of the memory cell array with the above structure according to the present invention will be described in detail hereinbelow.

For an erasing operation, by applying an erasing voltage of 5V to the selected source line and to an adjacent word line sharing the active source region with the selected cell and applying an erasing voltage of −9V to the word line of the selected cell and floating the selected bit line, the voltage applied to the source line is transferred to the source region of the selected cell via the source select transistor connected to the adjacent word line. Then, F-N tunneling is produced by the potential difference between the voltage applied to the source region of the selected cell and the negative voltage (−9V) applied to the selected word line, and the electrons in the floating gate are erased to the source region by F-N tunneling via the tunnel oxide film, thus dropping the threshold voltage Vth of the cell to about 2V. In this case, an erasing operation for the unselected byte cells of the selected word line is not performed because the source voltage is not applied thereto, and the voltage to be applied to the adjacent word line should be sufficiently low so as not to generate movement of electrons in the unselected byte cells by the F-N tunneling.

Further, the voltage to be applied to the adjacent word line sharing the active source region with the selected cell is made to be higher than that to be applied to the selected source line. As a result, it is possible to prevent the reduction of the pass voltage, i.e., the voltage to be transferred to the source region, due to the threshold voltage of an enhancement type source select transistor. It is preferred that the voltage of 7V higher than the sum of the source erasing voltage and the threshold voltage of the source select transistor be applied to the adjacent word line.

Furthermore, the source erasing voltage can be increased as needed and in this case, the absolute value of the negative voltage applied to the gate of the selected cell can be lowered.

Hence, if the thickness of the tunnel oxide film or the operating voltage of the cell is varied, it is possible to obtain an operating margin by applying an adequate voltage in accordance with the variation.

The programming operation is identical to that of the conventional flash memory cell. That is, by applying 5V to the selected bit line, 10V to the selected word line and 0V to the source line and the bulk substrate, parts of the CHEs are introduced to the floating gate via the tunnel oxide film by the gate electric field, thus increasing the threshold voltage of the cell to over 6V.

For a reading operation, 4~5 V is applied to the selected word line, 1V is applied to the bit line, and 0V is applied to the source line and the bulk substrate. As a result, cell current is generated in the case that the cell is erased, and thus the threshold voltage of the cell becomes lower than the word line voltage, while cell current is not generated in the case that the cell is programmed. Thus the data stored at the cell can be determined by the presence or absence of the cell current.

Figure 8:
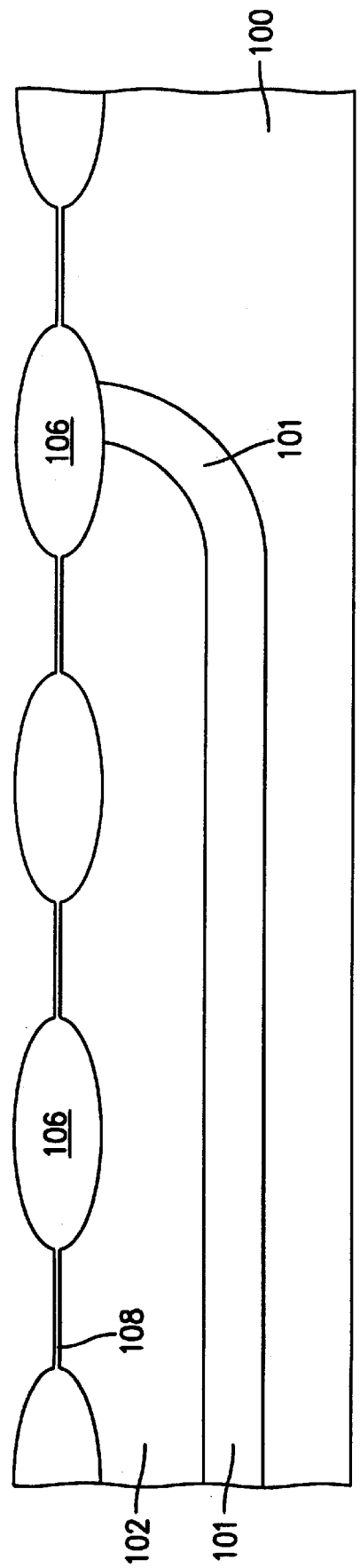
FIGS. 8 to 14 are schematic sectional views for describing one embodiment of the manufacturing method of the nonvolatile memory device of FIG. 6.

FIGS. 8 to 14 are schematic sectional views for describing the manufacturing method of the nonvolatile memory device according to an embodiment of the present invention as shown in FIG. 6. FIG. 8 shows the step of forming wells 101, 102, a field oxide film 106 and a tunnel oxide film 108. An n-type well 101 is first formed by ion implanting n-type impurity onto the p-type semiconductor substrate 100, using photolithography and ion implantation and then diffusing the n-type impurity to an intended depth by high-temperature thermal treatment. Then, a p-type well 102 is formed by ion implanting a p-type impurity onto the surface of the substrate while masking the n-type well 101 and a cell array region in the n-type well 101, using photolithography and ion implantation, and then diffusing the p-type impurity by high-temperature thermal treatment. In general, a well for forming an NMOS transistor thereon in a peripheral circuit region is referred to herein as a p-type well (not shown), while a well to be formed in the memory cell array region of the n-type well 101 is referred to herein as a pocket p-well 102.

Subsequently, the field oxide film 106 is formed on the substrate 100 to a thickness of 4000–5000 Å by a general device isolation process, for example, LOCOS (Local Oxidation of Silicon) or polysilicon buffered LOCOS (PBL), thereby defining an active region and a field region in the substrate 100. After the field oxide film 106 is formed, a sacrificial oxide film is formed to remove unintended films at the interface between the active region and the field region, and is then removed by wet etching.

The gate oxide film 108 usually called a tunnel oxide film is formed by growing an oxide film or an oxynitride film on the active region to a thickness of 100 Å. In this case, the ion implantation step of implanting p-type impurity, e.g., boron or $BF_2$, with an energy of e.g., 50 keV at a dose of, e.g., $1.5 \times 10^{13}$~$2.5 \times 10^{13}$ ion/cm$^2$, may be performed after forming the field oxide film 106, to control the threshold voltage of the cell.

Figure 9:
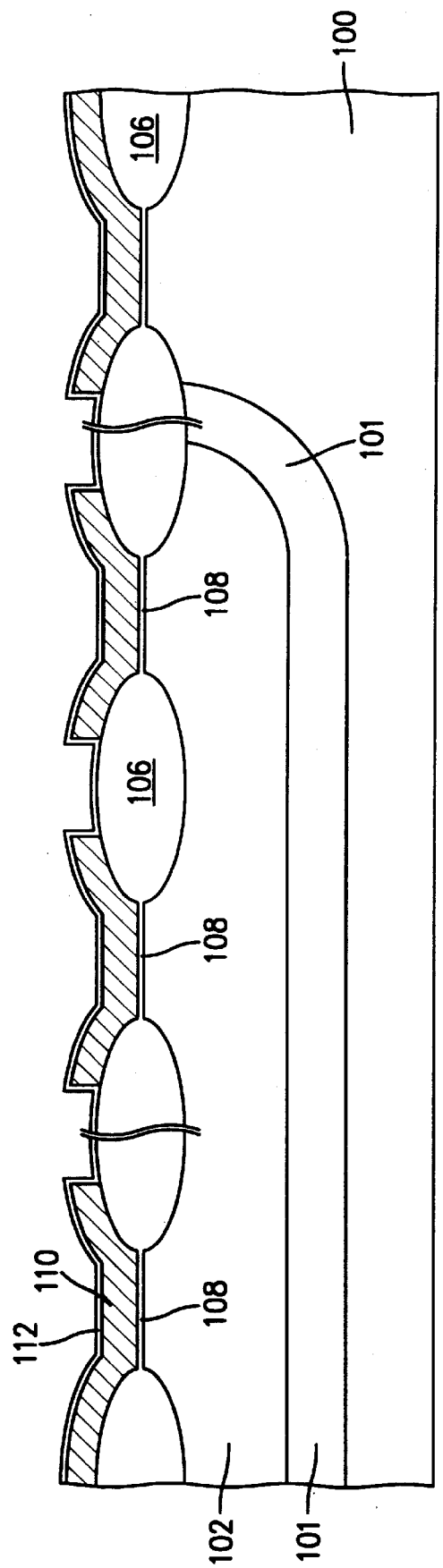

FIG. 9 shows the step of forming a first conductive layer 110 and an interpoly dielectric layer 112. After forming the tunnel oxide film as described above, the first conductive layer 110 to be used as a floating gate is deposited on the resultant structure having the gate oxide film 108 and doped to be of n type, for example, polysilicon, to a thickness of 1000 Å by chemical vapor deposition (CVD) and then depositing phosphorous-rich $POCL_3$. Then, floating gates of adjacent cells are isolated from each other by removing the first conductive layer 110 on the field oxide film 106 of the cell array by dry etching. That is, the first conductive layer 110 for the floating gate is formed to be a pattern covering the active region and a portion of the field oxide film 106 and removed from a portion of the field oxide film 106, thus extending in the bit line direction, as shown in FIG. 6. The first conductive layer 110 may be removed on the active region of a plurality of source lines parallel to the bit line. In a peripheral circuit region, the first conductive layer 110 is not etched by masking with a photoresist pattern (not shown) or the whole of the first conductive layer 110 on the above region is removed.

Then, to isolate the floating gate from a control gate on the resultant structure, for example, an ONO (Oxide/Nitride/

Oxide) film is formed as the interpoly dielectric layer 112. That is, the ONO film 112 is formed to a thickness of about 130~180 Å, by growing a first oxide film to a thickness of about 100 Å by oxidation of the first conductive layer 110, depositing a nitride film on the first oxide film to a thickness of about 130 Å, oxidizing the nitride film, and thus growing a second oxide film to a thickness of about 40 Å.

Figure 10:
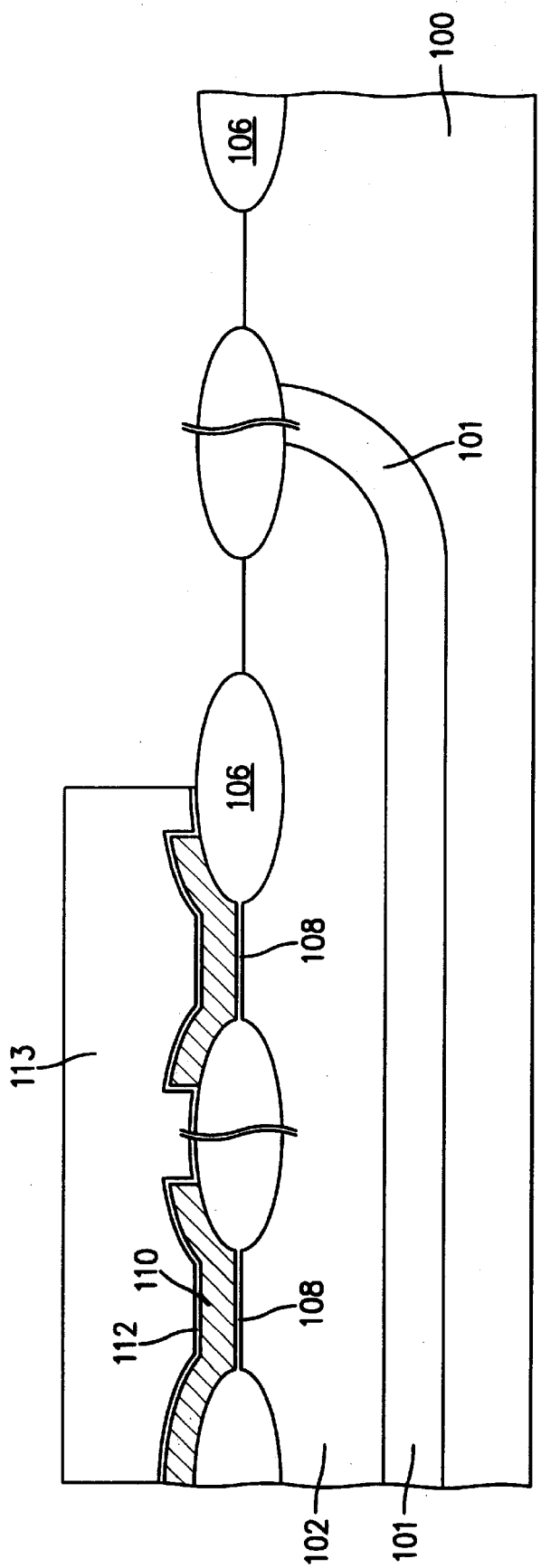

FIG. 10 shows the step of removing the interpoly dielectric layer 112 and the first conductive layer 110 in the peripheral circuit region and the active region of a plurality of source lines in parallel with the bit line. After forming the interpoly dielectric layer 112 as described above, a photoresist pattern 113 is formed by photolithography, to expose only the peripheral circuit region and the active region of a plurality of source lines in parallel with the bit line.

The interpoly dielectric layer 112 and the first conductive layer 110 of the exposed peripheral circuit region are sequentially removed by dry etching. The remaining insulating layer, i.e., the tunnel oxide film 108, is removed by wet etching, in consideration of possible damage to the substrate 100. In this case, if the first conductive layer 110 of the peripheral circuit region and the active region of a plurality of source lines has already been removed in the step of FIG. 9, the tunnel oxide film 108 is removed when the interpoly dielectric layer 112 is removed. Further, after the etching process, an ion implantation step of implanting p-type impurity may be performed to control the threshold voltage of the peripheral circuit transistor or of the source select transistor of the cell array to be formed on the active region of a plurality of source lines.

Figure 11:
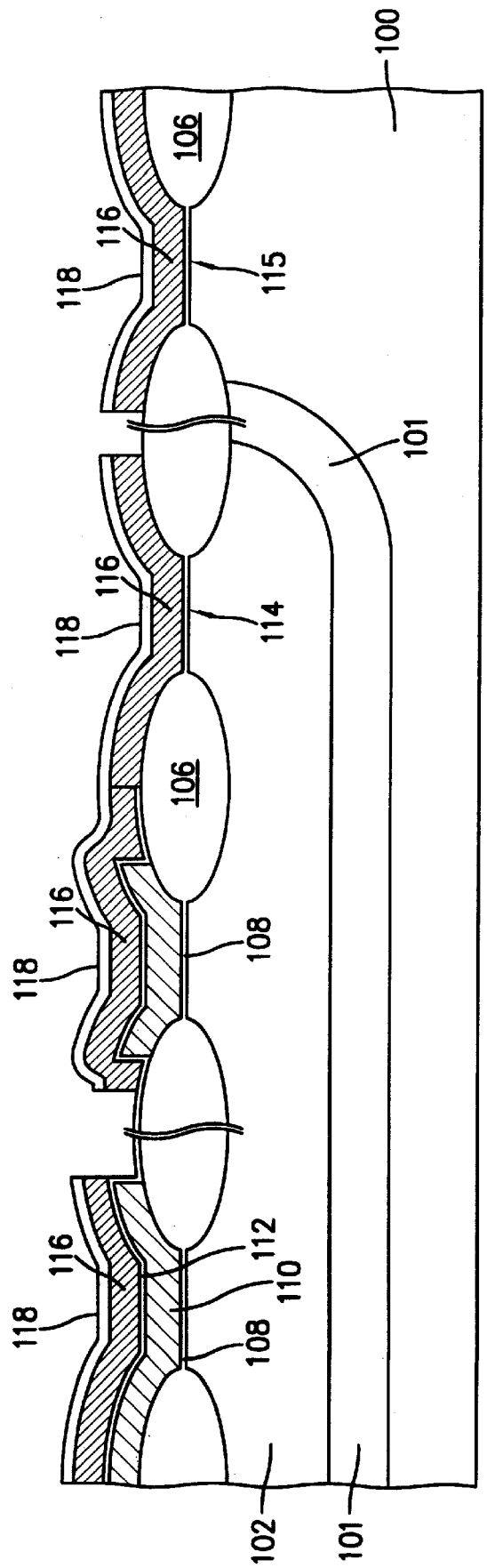

FIG. 11 shows the step of forming first and second gate oxide films 114 and 115, a second conductive layer 116 and an insulating layer 118. After removing the interpoly dielectric layer 112, the first conductive layer 110 and the tunnel oxide film 108 of the peripheral circuit region as described above, an oxide layer is grown onto the exposed active region by thermal oxidation. As a result, the first gate oxide film 114 is formed on the active region of source line where the source select transistor is to be formed, and the second gate oxide film 115 is formed on the active region of the peripheral circuit region. In one embodiment, the thickness of the first gate oxide film 114 of the source select transistor is equal to or thicker than the tunnel oxide film 108. This is to prevent the movement of electrons generated by, for example, F-N tunneling, from taking place at the source line region during the programming or erasing operation. Further, the thickness of the second gate oxide film 115 is determined in accordance with the driving capability of the peripheral circuit transistor. That is, if the operating voltage is less than 5V, the second gate oxide film 115 can be formed to, for example, a thickness of 100~160 Å, and if the operating voltage is over 10V, it can be formed to, for example, a thickness of 200~400 Å.

Then, a polycide layer is formed as the second conductive layer 116 to be used as the control gate on the resultant structure by sequentially depositing, for example, an n$^+$-doped polysilicon layer and a metal silicide layer such as tungsten silicide (Wsix), titanium silicide (TiSix), and tantalum silicide (TaSix). In one embodiment, it is preferred that the polysilicon layer and the metal silicide layer be formed to be 1000 Å and 1500 Å thick, respectively, by CVD.

Next, the insulating layer 118 is formed on the second conductive layer 116 by depositing an oxide layer, a nitride layer or a combination one of these layers to a thickness of 2000~4000 Å.

Figure 12:
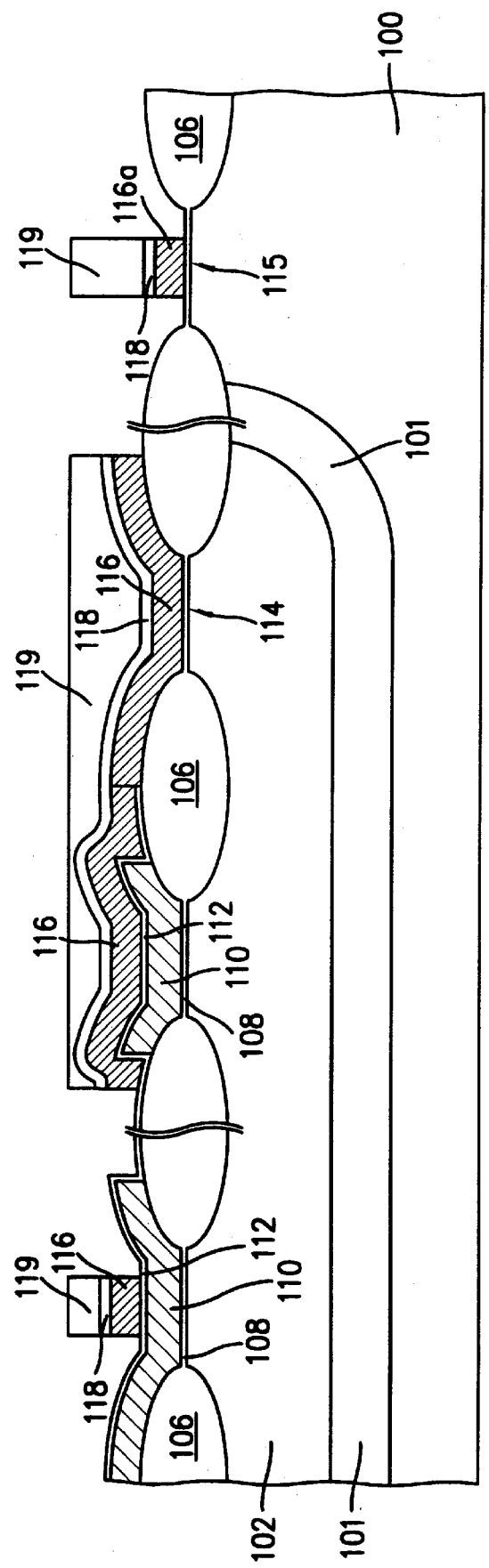

FIG. 12 shows the step of forming a gate pattern 116a of the peripheral circuit region.

After forming the insulating layer 118 as described above, a photo-resist pattern 119 for forming the word line pattern of the memory cell array and the gate pattern of the peripheral circuit region is formed by photolithography. Then, the exposed insulating layer 118 and the second conductive layer 116 are etched by using the photoresist pattern 119 as a mask. In this case, to solve the problem that etching gas is not uniformly supplied to the region where patterns are close together due to the height of the photoresist pattern 119, the photoresist pattern 119 may be removed after etching the exposed insulating layer 118, to etch the second conductive layer 116 by using an insulating layer thinner than the photoresist pattern 119 as a mask. With this process, a single-layer gate (116a, 116b) formed of the second conductive layer is formed at the peripheral circuit region and the region to be formed the source select transistor.

Figure 13:
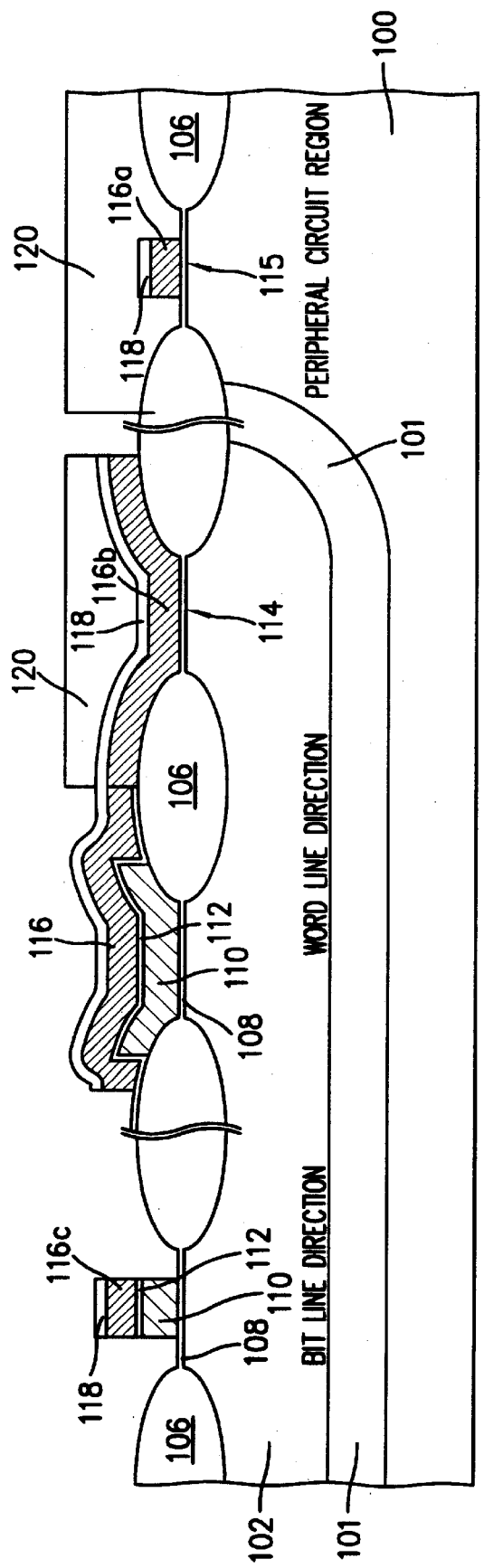

FIG. 13 shows the step of forming a stacked gate of the cell. After forming the single-layer gates (116a, 116b) of the peripheral circuit region and the region to be formed the source select transistor as described above, a photoresist pattern 120 is formed to mask the peripheral circuit region and the source line active region in the cell array by photolithography. Then, the interpoly dielectric layer 112 and the first conductive layer 110 are sequentially removed by using the exposed insulating layer 118 in the cell array as a mask, thereby forming a stacked gate of the floating gate 110 and control gate 116c.

Figure 14:
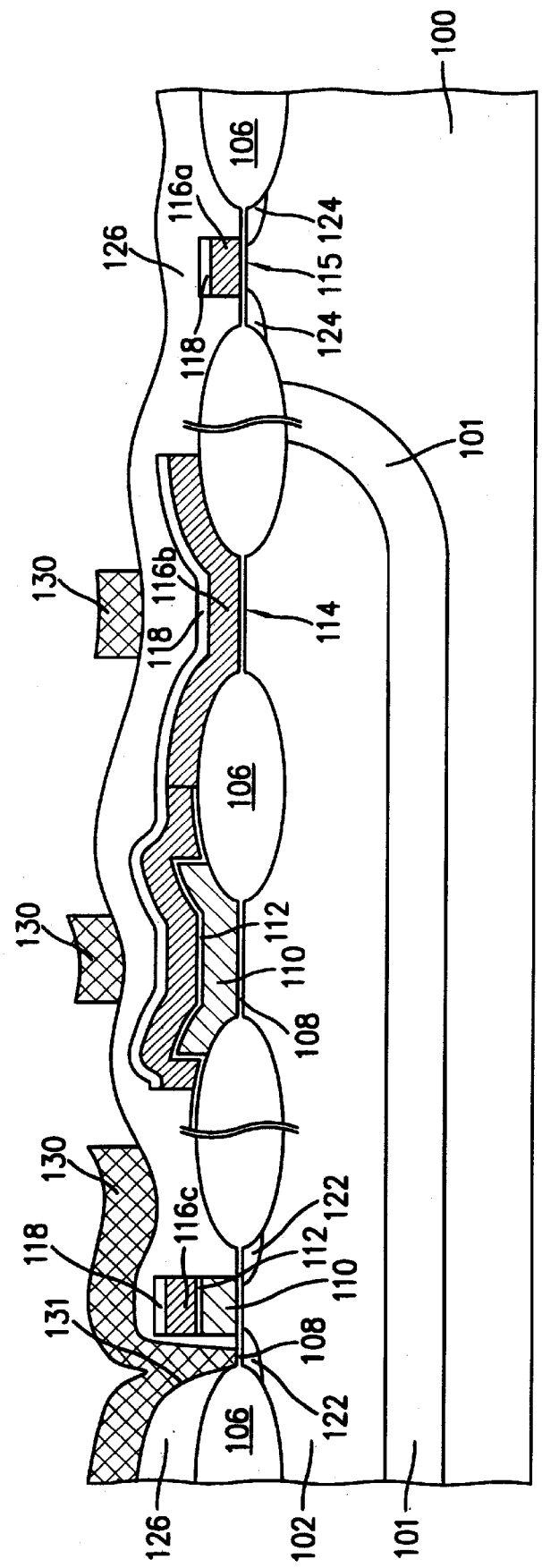

FIG. 14 shows the step of forming first and second source/drain regions 122 and 124 and the active source region 105 as shown in FIG. 6, a planar insulating layer 126 and a metal layer 130. After forming the stacked gate of the cell and the single-layer gate 116b of the source select transistor as described above, the first source/drain region 122 and the active source region 105 of the cell array is formed to be a conventional single junction structure or a double diffused (DD) junction structure, by ion implantation of n-type impurity. Alternatively, only one of the first source/drain region 122 can be formed to be a double diffused junction structure.

In one embodiment, a junction structure different from the cell, e.g., an LDD (Lightly Doped Drain) junction structure, may be formed at the exposed source/drain region of the source select transistor. Further, the ion implantation for forming the source,'drain region of the source select transistor may be performed simultaneously with the ion implantation for forming the second source/drain region 124 of the peripheral circuit transistor.

After forming the first and second source/drain regions 122 and 124 as described above, an HTO (high temperature oxidation) layer (not shown) can be deposited on the resultant structure to a thickness of about 1000 Å and a BPSG (Borophosphorsilicate Glass) layer can be deposited thereon to a thickness of about 5000 Å. Then, the planar layer 126 is formed by planarization of the surface of the BPSG layer by processing a reflow at a temperature of about 900. Thereafter, the layers deposited on the drain region of the cell are removed by wet and dry etching, thus forming a bit line contact hole 131. In this case, though not shown, the layers deposited on the source region of the source select transistor are also etched to form a source line contact hole. Here, the wet etching is used to improve the contact hole profile.

The metal layer 130, e.g., a silicide layer, a polycide layer or an aluminiun layer, is deposited on the resultant structure having the contact holes and is patterned by photoetching. As a result, the bit line being electrically connected to the drain region of the cell via the bit line contact hole 131, and the source line being connected to the active source region of the cell via the source line contact hole, are formed. After forming a metal contact hole and a metal layer if multi-layer interconnection is required, a passivation layer (not shown) can be formed on the resultant structure to complete the nonvolatile memory device of the present invention.

Figure 15:
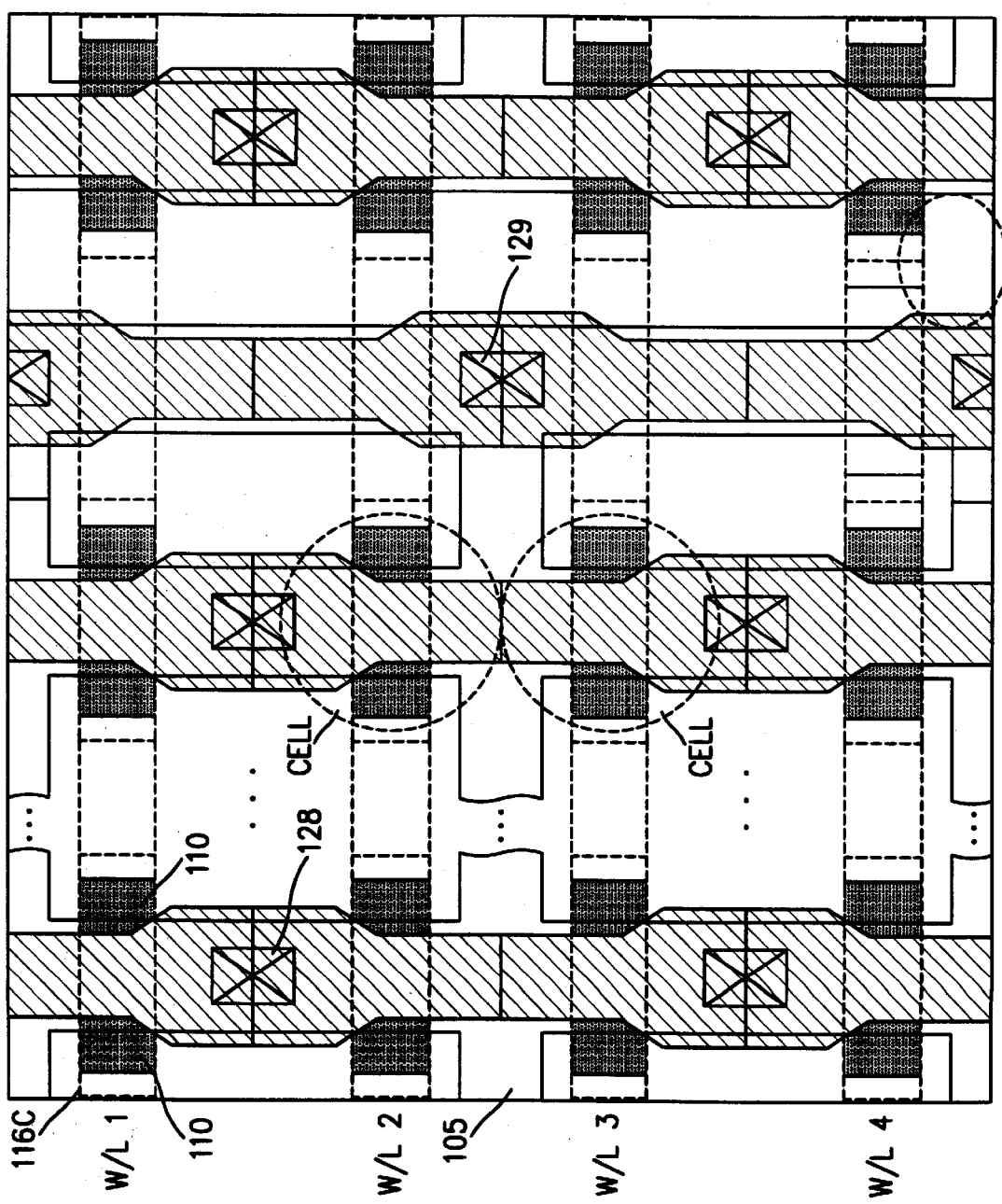
FIG. 15 is a partial schematic layout diagram of a memory cell array in a nonvolatile memory device according to another embodiment of the present invention.
Figure 16:
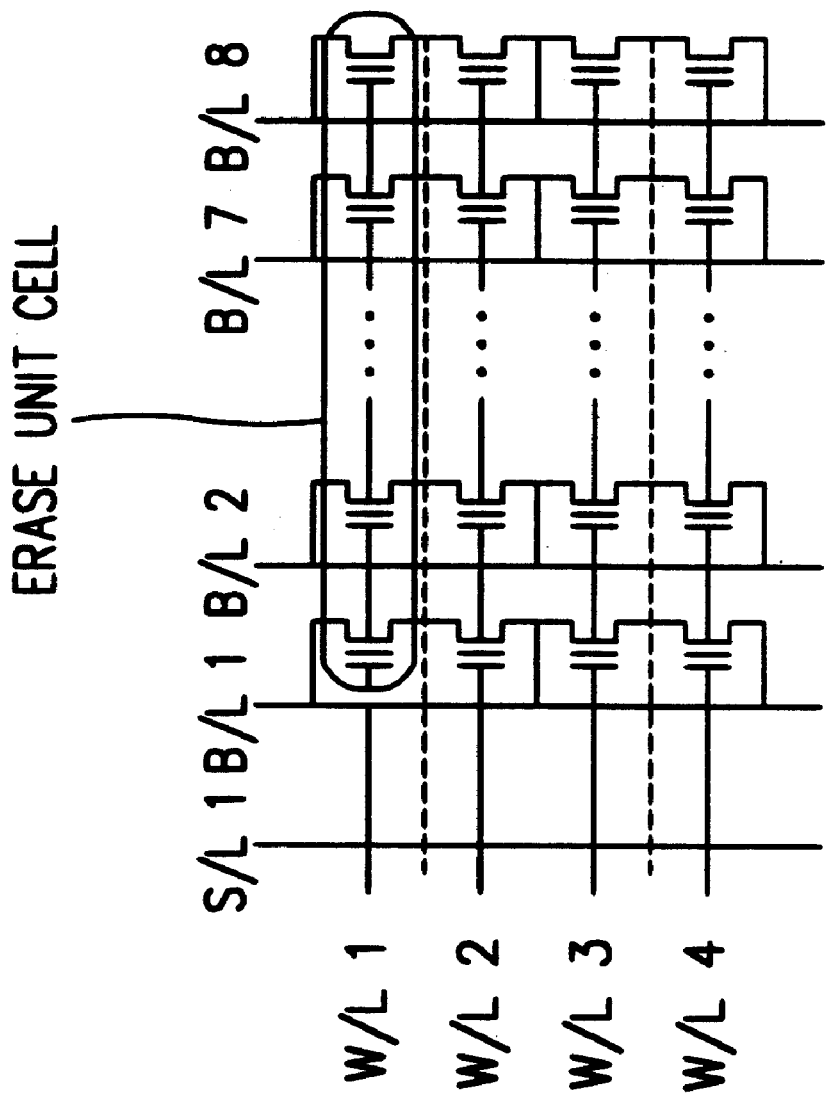
FIG. 16 is an equivalent circuit diagram of the cell array of FIG. 15.

FIG. 15 is a partial schematic layout diagram of a memory cell array in a nonvolatile memory device according to another embodiment of the present invention. FIG. 16 is an equivalent circuit diagram of the memory cell array of FIG. 15. Referring to FIGS. 15 and 16, in the memory cell array according to this alternative embodiment of the present invention, the active source region 105 is directly connected to the source line S/L vi a the source line contact 129 without the source select transistor, compared to the memory cell array of FIG. 6. Further, two cells sharing one bit line contact 128 are connected to the same source line S/L via respective active source regions 105 and respective source line contacts 129.

The programming and reading operations of the memory cell array according to this embodiment of the present invention are substantially similar to those of FIG. 6. The erasing operation thereof is performed according to the following description. For erasing, by applying an erasing voltage of 12V to the selected source line and applying 0V to the selected word line and floating the selected bit line, the electrons in the floating gate of the cell in the selected byte are erased to the source region. In this case, to keep the unselected cells coupled to the selected bit line stable, the unselected word lines are supplied with a disturb inhibition voltage of about 5V or floated.

In addition, by applying −5V to the selected word line and 7V to the selected source line and floating the selected bit line, the erasing operation can be performed by the potential difference between the word line arid the source line. In this case, tunneling disturbance due to a source line bias is prevented by floating the unselected word lines or applying a disturb inhibition voltage of about 5V thereto. Here, the disturb inhibition voltage may be lowered from 5V to Vcc, and preferably, is adjusted in accordance with the thickness of the tunnel oxide film or the operating voltage of the cell.

As described above, the source line parallel to the bit line is formed every byte so that the source line can serve to discharge a large amount of current generated during programming to a ground node and serve as a byte select line for byte erasing at the same time. Further, the active source regions connected to the source line are also divided in units of bytes, and the active source region is connected to the source line via the source select transistor arid the source line contact or via only source line contact without the source select transistor.

Therefore, the nonvolatile memory device of the present invention can perform byte erasing while employing high integration, thus reducing rewriting time when rewriting fewer bits of data.

While this invention has been particularly shown and described with reference to the preferred embodiments thereof, it will be understood by those skilled in the art that various changes in form and details may be made without departing from the spirit and scope of this invention as defined by the appended claims.

What is claimed is:

1. A nonvolatile memory device comprising:
an array of a plurality of memory cells, each cell having a stacked gate structure including a floating gate and a control gate, formed in an area where a plurality of bit lines intersect a plurality of word lines;
a plurality of source lines, each being arranged in parallel with said bit lines at an interval of one source line for a predetermined number of bit lines; and
a plurality of source select transistors being arranged in series in a direction of said source line, each transistor having a gate in an area where said source line intersects said word line;
wherein two cells are connected to a bit line via one bit line contact, two cells symmetrically arranged with respect to each other and connected to the same bit line via respective bit line contacts and sharing one active source region, said active source region being in parallel with said word line and connected to said source line via said source select transistor and a source line contact, and said source line being electrically isolated from another source line.

2. The nonvolatile memory device as claimed in claim 1, wherein said each source line is arranged in parallel with said bit lines at an interval of one source line for every byte of bit lines.

3. The nonvolatile memory device as claimed in claim 1, wherein the two cells sharing one bit line contact are connected to the same source line via respective active source regions, respective source select transistors and the same source line contact.

4. The nonvolatile memory device as claimed in claim 1, wherein said source select transistor is a MOS transistor having a single-layer gate.

5. A nonvolatile memory device comprising:
an array of a plurality of memory cells, each cell having a stacked gate structure including a floating gate and a control gate, formed in an area where a plurality of bit lines intersect a plurality of word lines;
a plurality of source lines, each being arranged in parallel with said bit lines at an interval of one source line for every byte of bit lines; and
a plurality of source select transistors being arranged in series in a direction of said one source line, each transistor having a gate in an area where said one source line intersects said word line;
wherein two cells are connected to a bit line via one bit line contact, two cells symmetrically arranged with respect to each other and connected to the same bit line via respective bit line contacts and sharing one active source region, said active source region being in parallel with said word line and connected to said one source line via said source select transistor and a source line contact, and said source line being electrically isolated from another source line, a plurality of said active source regions being connected in units of bytes, an active source region of a first byte being separated from an active source region of a second byte.

6. The nonvolatile memory device as claimed in claim 5, wherein the two cells sharing one bit line contact are connected to the same source line via respective active source regions, respective source select transistors and the same source line contact.

7. The nonvolatile memory device as claimed in claim 5, wherein said source select transistor is a MOS transistor having a single-layer gate.

8. A nonvolatile memory device comprising:

an array of a plurality of memory cells, each cell having a stacked gate structure including a floating gate and a control gate, formed in an area where a plurality of bit lines intersect a plurality of word lines;

a plurality of source lines, each being arranged in parallel with said bit lines at an interval of one source line for a predetermined number of bit lines; and a plurality of source select transistors being arranged in series in a direction of said source line, each transistor having a gate in an area where said source line intersects said word line, gate insulating layers of said source select transistors being formed to be thicker than gate insulating layers of said cells;

wherein two cells are connected to a bit line via one bit line contact, two cells symmetrically arranged with respect to each other and connected to the same bit line via respective bit line contacts and sharing one active source region, said active source region being in parallel with said word line and connected to said source line via said source select transistor and a source line contact, and said source line being electrically isolated from another source line.

9. A nonvolatile memory device comprising:

an array of a plurality of memory cells, each cell having a stacked gate structure including a floating gage and a control gate, formed in an area where a plurality of bit lines intersect a plurality of word lines; and a plurality of source lines arranged in parallel with said bit lines at an interval of one source line for every byte of bit lines;

wherein two cells are connected to a bit line via one bit line contact, two cells symmetrically arranged with respect to each other and connected to the same bit line via respective bit line contacts and sharing one active source region, said active source region being in parallel with said word lines and connected to said one source line via a source line contact, and said source line being electrically isolated from another source line, a plurality of said active source regions being connected in units of bytes, an active source region of a first byte being separated from an active source region of a second byte.

10. The nonvolatile memory device as claimed in claim 9, wherein the two cells sharing one bit line contact are connected to the same source line via respective active source regions and respective source line contacts.

* * * * *